(12) United States Patent
Wu et al.

(10) Patent No.: US 12,648,448 B2
(45) Date of Patent: Jun. 2, 2026

(54) ELECTRONIC DEVICE AND VARIABLE FREQUENCY CONTROL SYSTEM USING ELECTRONIC DEVICE

(71) Applicant: Copeland Climate Technologies (Suzhou) Co. Ltd., Suzhou (CN)

(72) Inventors: Shaoyang Wu, Suzhou (CN); Zhaoqing Hu, Suzhou (CN); Wei Zhang, Suzhou (CN)

(73) Assignee: Copeland Climate Technologies (Suzhou) Co. Ltd., Suzhou (CN)

( * ) Notice: Subject to any disclaimer, the term of this patent is extended or adjusted under 35 U.S.C. 154(b) by 300 days.

(21) Appl. No.: 18/563,544

(22) PCT Filed: Jun. 8, 2022

(86) PCT No.: PCT/CN2022/097552
§ 371 (c)(1),
(2) Date: Nov. 22, 2023

(87) PCT Pub. No.: WO2022/257952
PCT Pub. Date: Dec. 15, 2022

(65) Prior Publication Data
US 2024/0274546 A1 Aug. 15, 2024

(30) Foreign Application Priority Data
Jun. 11, 2021 (CN) .......................... 202110655391.0

(51) Int. Cl.
*H10W 42/20* (2026.01)
*H10W 20/41* (2026.01)
(Continued)

(52) U.S. Cl.
CPC ......... *H10W 42/20* (2026.01); *H10W 20/427* (2026.01); *H10W 20/435* (2026.01); *H10W 20/4473* (2026.01); *H10W 40/259* (2026.01)

(58) Field of Classification Search
CPC ............. H10W 42/20; H10W 20/4473; H10W 20/427
(Continued)

(56) References Cited

U.S. PATENT DOCUMENTS

2012/0188727 A1 7/2012 Lin et al.
2013/0032861 A1* 2/2013 Lee .......................... G06F 3/047
257/415
(Continued)

FOREIGN PATENT DOCUMENTS

CN 101986543 A 3/2011
CN 102610590 A 7/2012
(Continued)

OTHER PUBLICATIONS

Chinese First Office Action regarding Application No. 202110655391.0, dated Apr. 17, 2025, with English translation.
(Continued)

*Primary Examiner* — Xia L Cross
(74) *Attorney, Agent, or Firm* — Harness, Dickey & Pierce, P.L.C.

(57) ABSTRACT

An electronic device and a variable frequency control system using the electronic device. The electronic device may comprise: a shielding layer, which is inserted between a
(Continued)

current outflow terminal of a switching device and a grounding conductor; and a conductive elastomer, which is used for connecting the current outflow terminal to the shielding layer.

10 Claims, 4 Drawing Sheets

(51) Int. Cl.
  H10W 20/44 (2026.01)
  H10W 40/25 (2026.01)
(58) Field of Classification Search
  USPC ........................................................ 257/659
  See application file for complete search history.

(56) References Cited

U.S. PATENT DOCUMENTS

| | | | |
|---|---|---|---|
| 2018/0277489 A1 | 9/2018 | Han et al. | |
| 2019/0287752 A1* | 9/2019 | Hirayama | G03B 17/02 |
| 2019/0311994 A1 | 10/2019 | Hong et al. | |
| 2020/0343155 A1* | 10/2020 | Kiyonaga | H01L 23/42 |

FOREIGN PATENT DOCUMENTS

| | | |
|---|---|---|
| CN | 108630624 A | 10/2018 |
| CN | 110349938 A | 10/2019 |
| EP | 3731605 A1 | 10/2020 |
| JP | 2007123804 A | 5/2007 |
| JP | 2010102931 A | 5/2010 |
| JP | 2012253221 A | 12/2012 |

OTHER PUBLICATIONS

J. Baojun et al., Suppression Method of Conducted EMI in Motor Driven System, Electric Drive, vol. 36, No. 5, 2006.

International Search Report (English and Chinese) and Written Opinion of the ISA (Chinese) issued in PCT/CN2022/097552, mailed Jul. 29, 2022; ISA/CN.

Chinese Second Office Action regarding Application No. 202110655391.0, dated Feb. 5, 2026, with English translation.

* cited by examiner

1

ELECTRONIC DEVICE AND VARIABLE FREQUENCY CONTROL SYSTEM USING ELECTRONIC DEVICE

The present application is a U.S. National Phase Application under 35 U.S.C. 371 of International Application No. PCT/CN2022/097552, filed on Jun. 8, 2022, which claims priority to Chinese Patent Application No. 202110655391.0, titled "ELECTRONIC DEVICE AND FREQUENCY CONVERSION CONTROL SYSTEM APPLIED THERETO", filed on Jun. 11, 2021 with the China National Intellectual Property Administration. The entire disclosures of these applications are incorporated herein by reference in their entirety.

FIELD

The present disclosure relates to the field of circuits, and in particular to an electronic device for suppressing a common-mode noise and a frequency conversion control system to which the electronic device is applied.

BACKGROUND

The contents of this part only provide background information related to the present disclosure and may not constitute the conventional technology.

Common-mode noise is a key point in solving electromagnetic compatibility (EMC) problems. Once a product design topology is determined, there are two traditional solutions to the problem of common-mode noise in electromagnetic compatibility. In one solution, the problem is solved by designing an electromagnetic interference (EMI) filter with a complex structure (as illustrated in FIG. 6). It is usually required to arrange two levels of filters at an input front end of a driver to meet requirements in standards EN55022 (EN55032) CISPR22 Class B. In addition, one or more magnetic loops are required to be arranged on input and output cables to account for the effect of the cables. Moreover, considering an impact of a radiation noise caused by a metal radiator, some products may be required to be provided with a shielding structure, including a shielding cable and a shielding box.

In another common way, EMC performance of a PCB is improved by reducing energy of a noise source and designing the PCB as a stacked structure. Alternatively, EMC performance of a product is improved by sacrificing thermal performance of a power component.

However, the solution in which an EMI filter structure is designed has the following disadvantages. In order to improve EMI performance, all common-mode current loops are required to be covered. However, it is complex and difficult to process all loops in a practical system. Therefore, the solution is costly and inefficient. In addition, the solution in which a source noise is optimized has a disadvantage of increasing a switching loss of a power module, which results in an increase of a temperature of a power device, thereby reducing a lifespan and reliability of the product.

Therefore, it is required to provide a low-cost and efficient electronic device for suppressing a common-mode noise in the art.

SUMMARY

The summary part provides a general summary of the present disclosure, rather than a comprehensive disclosure of a full scope or all features of the present disclosure.

An objective of the present disclosure is to provide an electronic device for suppressing a common-mode noise and a frequency conversion control system to which the electronic device is applied.

In an aspect of the present disclosure, an electronic device is provided. The electronic device includes a shielding layer and a conductive elastomer. The shielding layer is interposed between a current outflow terminal of a switching device and a grounding conductor. The conductive elastomer is configured to connect the current outflow terminal and the shielding layer.

Preferably, in the electronic device, a first thermal conductive insulation layer and a second thermal conductive insulation layer may be further arranged between the current outflow terminal and the grounding conductor, and the shielding layer may be arranged between the first thermal conductive insulation layer and the second thermal conductive insulation layer.

Preferably, in the electronic device, a first surface of the conductive elastomer may be in contact with a surface, facing the shielding layer, of the current outflow terminal, a second surface of the conductive elastomer may be in contact with the shielding layer, and the second surface is opposite to the first surface.

Preferably, in the electronic device, the current outflow terminal may be flat, and the conductive elastomer may be a cube.

Preferably, in the electronic device, the switching device may be an MOSFET or IGBT, and a pin of a source electrode of the switching device may serve as the current outflow terminal.

Preferably, in the electronic device, the conductive elastomer may be made of conductive rubber.

Preferably, in the electronic device, the grounding conductor may be a metal radiator.

Preferably, in the electronic device, the shielding layer may be a metal shielding layer.

Preferably, in the electronic device, the first thermal conductive insulation layer and the second thermal conductive insulation layer may be made of ceramic.

In another aspect of the present disclosure, a frequency conversion control system is provided. The frequency conversion control system includes a frequency conversion driver. The frequency conversion driver is provided with the electronic device descried above.

With the electronic device according to the present disclosure, EMI performance can be improved without reducing reliability and efficiency of an existing product, thereby effectively reducing a cost of other component for EMI countermeasure. In addition, the electronic device can be conveniently applied to mass-produced products.

A further applicable field becomes apparent from the description herein. The description and specific examples in the summary are only illustrative and are not intended to limit the scope of the present disclosure.

BRIEF DESCRIPTION OF THE DRAWINGS

The drawings described herein are used for illustrating the selected embodiments only rather than all of possible embodiments, and are not intended to limit the scope of the present disclosure. In the drawings.

Figure 1:
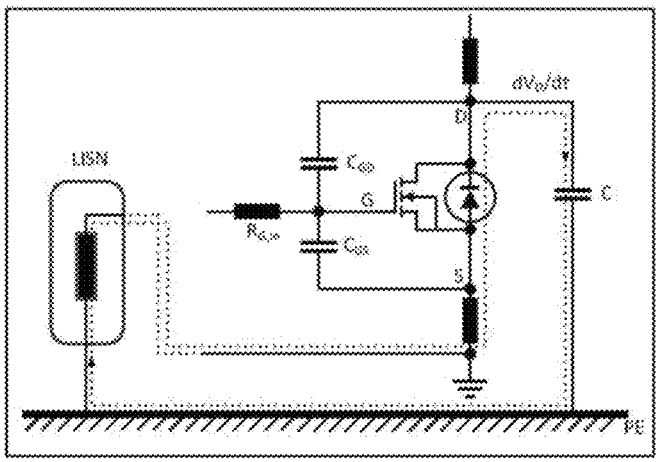
FIG. 1 is a schematic diagram illustrating a principle of an electronic device according to the present disclosure.
Figure 1:
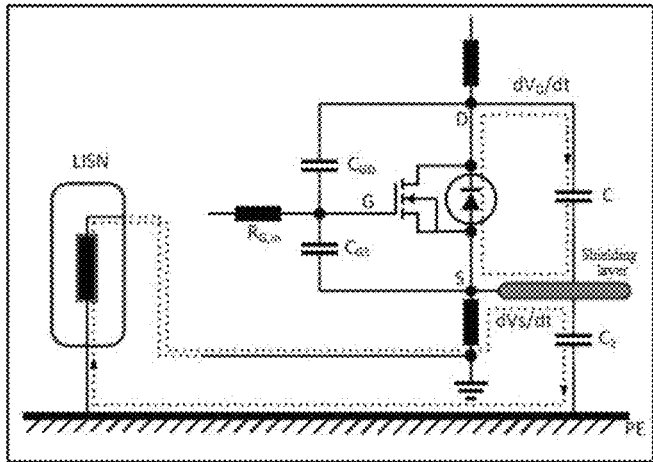

Although the present disclosure is susceptible to various modifications and substitutions, specific embodiments thereof are illustrated in the drawings as examples and are described in detail herein. However, it should be understood that the description of specific embodiments herein is not intended to limit the present disclosure into a disclosed specific form. Instead, the present disclosure aims to cover all modifications, equivalents and substitutions within the spirit and the scope of the present disclosure. It should be noted that, corresponding reference numerals indicate corresponding components throughout the drawings.

DETAILED DESCRIPTION OF EMBODIMENTS

Now, examples of the present disclosure are described more fully with reference to the drawings. The following description is merely illustrative in nature and is not intended to limit the present disclosure and application or use.

Exemplary embodiments are provided so that the present disclosure can become exhaustive and the scope of the present disclosure can be fully conveyed to those skilled in the art. Examples of various specific details such as specific components, apparatuses, and methods are set forth to provide detailed understanding of the embodiments of the present disclosure. It is apparent to those skilled in the art that without specific details, the exemplary embodiments may be implemented in multiple different forms, none of which is construed as limiting the scope of the present disclosure. In some exemplary embodiments, well-known processes, well-known structures, and well-known technologies are not described in detail.

A principle diagram of an electronic device according to the present disclosure is described below with reference to FIG. 1. FIG. 1(a) illustrates generation and a propagation path of a common-mode noise without application of an electronic device according to the present disclosure, and FIG. 1(b) illustrates generation and a propagation path of a common-mode noise with application of an electronic device according to the present disclosure.

The electronic device according to the present disclosure is based on the principle of generation and propagation of the common-mode noise. A main source of the common-mode noise is a fast switching behavior ("di/dt" and "dv/dt") of a power electronic device. As illustrated in FIG. 1(a), a loop indicated by a dotted arrow illustrates a propagation loop of a common-mode noise that is measured by a line impedance stabilization network (LISN) and is caused by stray capacitance C of a circuit illustrated in FIG. 1(a). The common-mode noise is mainly propagated through the stray capacitance C between the circuit and the ground, and finally a common-mode interference noise is generated.

In addition, $C_{GD}$ and $C_{GS}$ in FIG. 1 represent other stray capacitances, $R_{G\ in}$ represents a resistor connected to a gate G of a MOSFET having a bulk diode, and PE represents the ground or a grounding conductor connected to the ground. It should be noted that an example in which the MOSFET serves as a power switching device is only illustrated. Apparently, other switching device such as an IGBT may also serve as the power switching device.

As illustrated in FIG. 1(b), the common-mode noise loop can be reduced by interposing a shielding metal layer between the power switching device and the grounding conductor (for example, a radiator) and connecting the shielding metal layer to a pin of a source terminal S of the MOSFET. It can be seen from FIG. 1(b) that the common-mode noise loop is reduced to a loop that is under the shielding metal layer and passes through the stray capacitance $C_2$. In this way, a voltage "dv" between a reference metal plane and the ground can also be reduced. It should be noted that a voltage of an original metal plane is "$dV_D$", and a voltage of the metal plane to the ground voltage with application of the electronic device according to the present disclosure is "dVs". In this way, a common-mode current caused by parasitic capacitance between the metal backplane of the power device and the ground can be greatly reduced.

The structure of the electronic device for suppressing a common-mode noise according to the embodiments of the present disclosure is described below with reference to FIG. 2 to FIG. 5.

Figure 2:
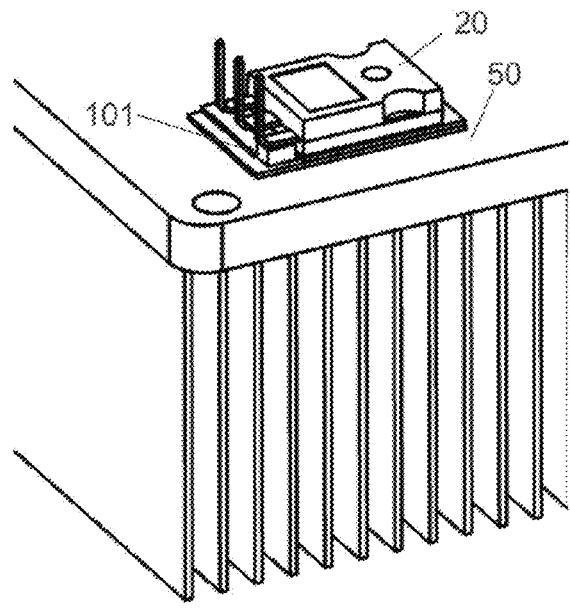
FIG. 2 is a perspective view illustrating an installation state of an electronic device according to an embodiment of the present disclosure.
Figure 3:
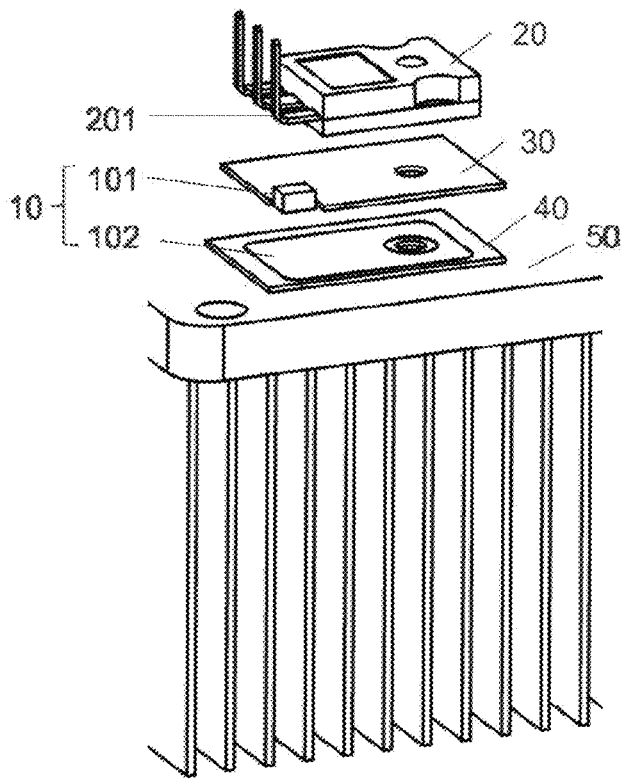
FIG. 3 is an exploded view illustrating an installation state of the electronic device illustrated in FIG. 2.
Figure 4:
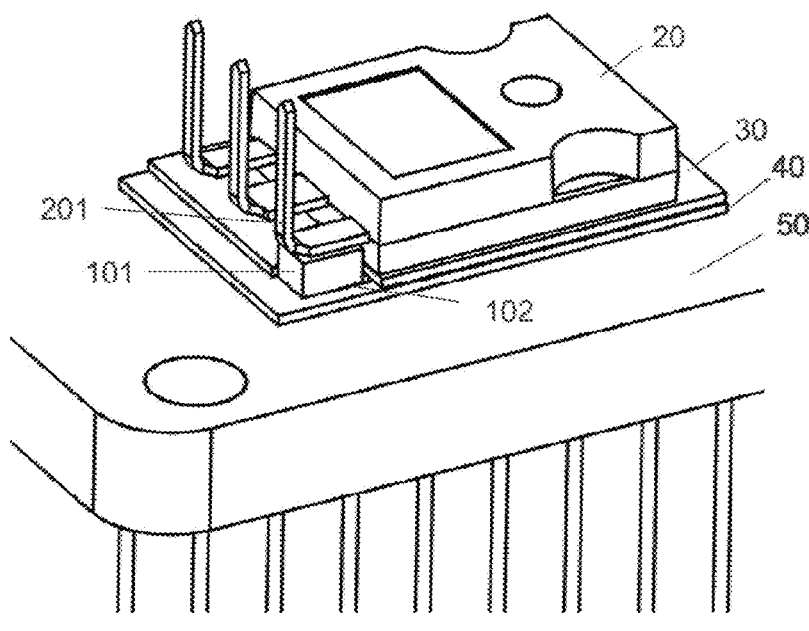
FIG. 4 is an enlarged perspective structural diagram illustrating the installation state of the electronic device corresponding to FIG. 2.
Figure 5:
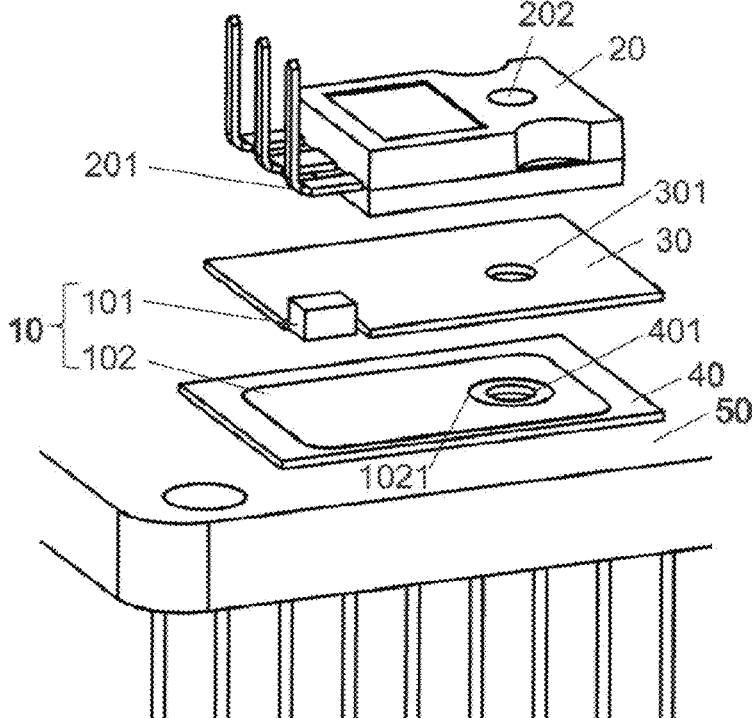
FIG. 5 is an enlarged exploded view illustrating the installation state of the electronic device corresponding to FIG. 3.

FIG. 2 is a perspective view illustrating an installation state of an electronic device according to an embodiment of the present disclosure. FIG. 3 is an exploded view illustrating an installation state of the electronic device illustrated in FIG. 2. FIG. 4 is an enlarged perspective structural diagram illustrating the installation state of the electronic device corresponding to FIG. 2. FIG. 5 is an enlarged exploded view illustrating the installation state of the electronic device corresponding to FIG. 3. As illustrated in FIG. 3 and FIG. 5, the electronic device 10 may include a conductive elastomer 101 and a shielding layer 102 (for example, a metal shielding layer). The shielding layer 102 is interposed between a current outflow terminal 201 of a switching device 20 and a grounding conductor 50 (for example, a metal radiator), and the conductive elastomer 101 is configured to connect the current outflow terminal 201 and the shielding layer 102.

Specifically, a first thermal conductive insulation layer 30 and a second thermal conductive insulation layer 40 are further arranged between the current outflow terminal 201 and the grounding conductor 50, and the shielding layer 102 is arranged between the first thermal conductive insulation layer 30 and the second thermal conductive insulation layer 40. Specifically, the first thermal conductive insulation layer 30 is arranged between the switching device 20 and the shielding layer 102, and the second thermal conductive insulation layer 40 is arranged between the shielding layer 102 and the grounding conductor 50. The first thermal conductive insulation layer 30 and the second thermal conductive insulation layer 40 have a function of electrical isolation, and can effectively conducting heat from switching device 20 to the grounding conductor 50. Preferably, both the first thermal conductive insulation layer 30 and the second thermal conductive insulation layer 40 are made of ceramics.

As illustrated in FIG. 2 and FIG. 4, in the installation state, the current outflow terminal 201 and the shielding layer 102 are electrically connected via the conductive elastomer 101, so that the common-mode noise loop can be reduced, and the common mode current caused by the parasitic capacitance between the metal backplane of the power device and the ground can be greatly reduced, as described above with respect to FIG. 1.

For example, as illustrated in FIG. 3 and FIG. 5, the conductive elastomer 101 may pass through an opening or a through hole on the first thermal conductive insulation layer 30 (for example, an opening on a corner of the first thermal conductive insulation layer 30 as illustrated in the Figures), so as to electrically connect the current outflow terminal 201 and the shielding layer 102.

Preferably, a thermally conductive adhesive may be applied between the conductive elastomer 101 and the current outflow terminal 201 and between the conductive elastomer 101 and the shielding layer 102, so as to form a closer contact between the conductive elastomer 101 and the current outflow terminal 201 and a closer contact between the conductive elastomer 101 and the shielding layer 102.

Although FIG. 3 and FIG. 5 illustrate that the shielding layer 102 is arranged on a surface, facing the first thermal conductive insulation layer 30, of the second thermal conductive insulation layer 40, the shielding layer 102 may be applied either on a surface, facing the second thermal conductive insulation layer 40, of the first thermal conductive insulation layer 30, or a surface, facing the first thermal conductive insulation layer 30, of the second thermal conductive insulation layer 40. In addition, the shielding layer 102 may be a thin metal layer that is simply arranged between the first thermal conductive insulation layer 30 and the second thermal conductive insulation layer 40 rather than being applied thereon.

Preferably, a thermally conductive adhesive may be applied between the shielding layer 102 and the first thermal conductive insulation layer 30 and between the shielding layer 102 and the second thermal conductive insulation layer 40, so as to form a closer contact between the shielding layer 102 and the first thermal conductive insulation layer 30 and a closer contact between the shielding layer 102 and the second thermal conductive insulation layer 40.

In the example illustrated in FIG. 2 to FIG. 5, a first surface (an upper surface in the Figures) of the conductive elastomer 101 may be in contact with a surface, facing the shielding layer 102, of the current outflow terminal 201, and a second surface (a lower surface in the Figures) of the conductive elastomer 101 may be in contact with the shielding layer 102, where the second surface is opposite to the first surface. In this way, two opposite surfaces (the first surface and the second surface) of the conductive elastomer 101 are in sufficient contact with the current outflow terminal 201 and the shielding layer 102 respectively, so that contact areas can be increased, so as to form a stable contact structure.

Preferably, as illustrated in FIG. 2 to FIG. 5, the current outflow terminal 201 may be flat and the conductive elastomer 101 may be a cube.

As illustrated in FIG. 5, a through hole 202 may be provided on the switching device 20, a through hole 301 may be provided on the first thermal conductive insulation layer 30, a through hole 1021 may be provided on the shielding layer 102, a through hole 401 may be provided on the second thermal conductive insulation layer 40, and a corresponding hole not illustrated may be provided on the grounding conductor 50. The through hole 202, the through hole 301, the through hole 1021, the through hole 401 and the corresponding through hole provided on the grounding conductor 50 are aligned with each other in the above-described installation state, so that the switching device 20, the first thermal conductive insulation layer 30, the shielding layer 102 and the second thermal conductive insulation layer 40 can be fixed to the grounding conductor 50 via a fastener such as a screw. An aperture of the through hole 1021 is larger than apertures of the through hole 301 and the through hole 401 as illustrated, to avoid contact between the shielding layer 102 and the grounding conductor via the fastener.

Preferably, the conductive elastomer 101 may be made of a conductive rubber. In this case, the conductive elastomer may have appropriate elasticity for being installed, so that the electronic device 10 can be conveniently applied to mass-produced products. Apparently, the conductive elastomer 101 may also be made of other material as long as the current outflow terminal 201 and the shielding layer 102 can be electrically connected via the conductive elastomer 101.

Furthermore, although the conductive elastomer 101 in this embodiment is a cube, it should be understood that the conductive elastomer 101 is not limited to a cube, and may be other shapes such as a cylinder (having two opposite parallel surfaces contacting with the current outflow terminal 201 and the shielding layer 102, respectively).

In addition, the electronic device 10 according to this embodiment is applicable to multiple types of switching devices, as long as a current outflow terminal of the switching device is connected to the electronic device 10 as described above. For example, in a case where the switching device is an MOSFET or IGBT, the current outflow terminal 201 is a pin of a source electrode of the MOSFET or IGBT.

With the electronic device according to the present disclosure, EMI performance can be improved without reducing reliability and efficiency of an existing product, thereby effectively reducing a cost of other component for EMI countermeasure. In addition, the electronic device has a simple structure, a low cost, and a high efficiency, and therefore can be mass-produced.

Figure 6:
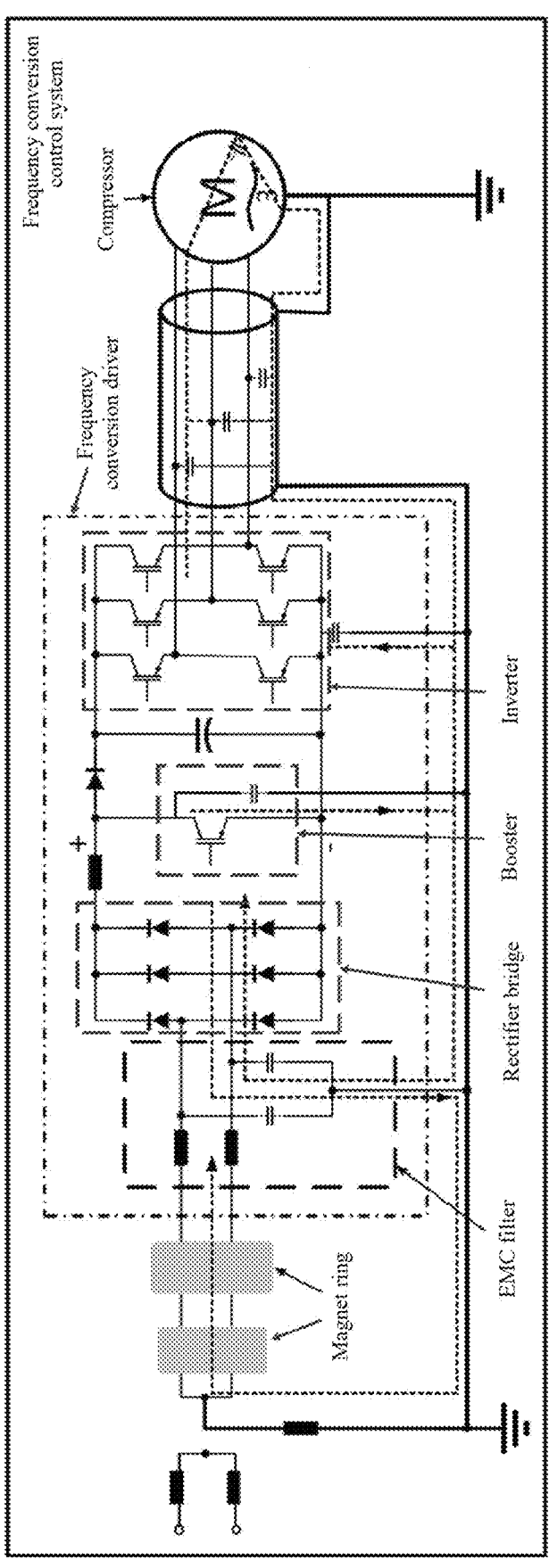
FIG. 6 is a schematic structural diagram of a frequency conversion control system to which the electronic device according to the embodiments of the present disclosure is applicable.

The electronic device 10 according to the embodiments of the present disclosure described above with reference to FIG. 2 to FIG. 5 is applicable to a frequency conversion control system as illustrated in FIG. 6. The frequency conversion control system is used for converting an inputted alternating current with a constant frequency into an alternating current with a variable frequency, for example, converting a power frequency electricity with a frequency of 50 Hz to an alternating current with a variable frequency ranging from 30 Hz to 120 Hz.

The frequency conversion control system illustrated in FIG. 6 includes a frequency conversion driver. The frequency conversion driver may include a rectifier bridge, a booster, an inverter, and the like. From FIG. 6 it can be seen that the booster and inverter each includes one or more switching devices. Thus, the electronic device 10 according to the embodiments of the present disclosure may be applied to one or more switching devices in the booster and inverter to suppress a common-mode noise in the circuit.

Although the embodiments of the present disclosure have been described above in detail with reference to the drawings, it should be understood that the above-described embodiments are merely used for illustrating the present disclosure and are not intended to limit the present disclosure. Those skilled in the art can make various modifications and variations to the above-described embodiments without departing from the substance and scope of the present disclosure. Therefore, the scope of the present disclosure is defined only by the appended claims and their equivalents.

The invention claimed is:

1. An electronic device comprising:
   a shielding layer interposed between a current outflow terminal of a switching device and a grounding conductor; and
   a conductive elastomer configured to connect the current outflow terminal and the shielding layer.

2. The electronic device according to claim 1, wherein a first thermal conductive insulation layer and a second thermal conductive insulation layer are further arranged between the current outflow terminal and the grounding conductor, and the shielding layer is arranged between the first thermal conductive insulation layer and the second thermal conductive insulation layer.

3. The electronic device according to claim 2, wherein the first thermal conductive insulation layer and the second thermal conductive insulation layer are made of ceramic.

4. The electronic device according to claim 1, wherein a first surface of the conductive elastomer is in contact with a surface, facing the shielding layer, of the current outflow terminal, a second surface of the conductive elastomer is in contact with the shielding layer, and the second surface is opposite to the first surface.

5. The electronic device according to claim 4, wherein the current outflow terminal is flat, and the conductive elastomer is a cube.

6. The electronic device according to claim 1, wherein the switching device is an MOSFET or IGBT, and a pin of a source electrode of the switching device serves as the current outflow terminal.

7. The electronic device according to claim 1, wherein the conductive elastomer is made of conductive rubber.

8. The electronic device according to claim 1, wherein the grounding conductor is a metal radiator.

9. The electronic device according to claim 1, wherein the shielding layer is a metal shielding layer.

10. A frequency conversion control system, comprising:
a frequency conversion driver provided with the electronic device according to claim 1.

* * * * *